United States Patent
Purcarea et al.

(10) Patent No.: US 12,113,518 B2
(45) Date of Patent: Oct. 8, 2024

(54) CIRCUIT ARRANGEMENT FOR CONTROLLING A PLURALITY OF SEMICONDUCTOR SWITCHES CONNECTED IN PARALLEL

(71) Applicant: Robert Bosch GmbH, Stuttgart (DE)

(72) Inventors: Calin Purcarea, Muehlacker (DE); Daniel Schweiker, Ludwigsburg (DE); Matthias Boesing, Ludwigsburg (DE); Tim Bruckhaus, Asperg (DE); Tobias Richter, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/763,176

(22) PCT Filed: Aug. 28, 2020

(86) PCT No.: PCT/EP2020/074079
§ 371 (c)(1),
(2) Date: Mar. 23, 2022

(87) PCT Pub. No.: WO2021/058227
PCT Pub. Date: Apr. 1, 2021

(65) Prior Publication Data
US 2022/0345125 A1     Oct. 27, 2022

(30) Foreign Application Priority Data
Sep. 24, 2019   (DE) .................. 10 2019 214 539.6

(51) Int. Cl.
*H03K 17/082* (2006.01)

(52) U.S. Cl.
CPC ... *H03K 17/082* (2013.01); *H03K 2217/0027* (2013.01)

(58) Field of Classification Search
CPC ..... H03K 17/08; H03K 17/081–08148; H03K 17/082–0828; H03K 2217/00;
(Continued)

(56) References Cited

U.S. PATENT DOCUMENTS

| | | | |
|---|---|---|---|
| 5,351,162 A * | 9/1994 | Koishikawa | H03K 17/08122 361/18 |
| 7,983,013 B2 * | 7/2011 | Huang | H03K 17/168 361/93.1 |

(Continued)

FOREIGN PATENT DOCUMENTS

| | | |
|---|---|---|
| DE | 102014006951 | 5/2017 |
| DE | 112014006951 T5 | 5/2017 |
| EP | 0517261 | 12/1992 |

OTHER PUBLICATIONS

Translation of International Search Report for Application No. PCT/EP2020/074079 dated Nov. 5, 2020 (2 pages).

*Primary Examiner* — Thienvu V Tran
*Assistant Examiner* — Carlos O Rivera-Perez
(74) *Attorney, Agent, or Firm* — Michael Best & Friedrich LLP

(57) ABSTRACT

The invention relates to a circuit arrangement (200) for controlling a plurality of semiconductor switches connected in parallel, having an activation connection (213) and a deactivation connection (214), and having a plurality of control connections (220), each provided for connection to a control connection (123) of one of the plurality of semiconductor switches, wherein the activation connection (213) and the deactivation connection (214) are each connected to each of the plurality of control connections (220), and wherein a circuit breaker (230) is provided between the activation connection (213) and at least one of the control connections (220), furthermore having at least one detection and control arrangement which is designed to detect a (Continued)

current flow in the at least one of the control connections (220) and, if a short-circuit is detected on the basis of the current flow, to control the circuit breaker (230) to open.

10 Claims, 4 Drawing Sheets

(58) Field of Classification Search
CPC .......... H03K 2217/0027; H03K 17/12; H03K 17/122; H03K 17/127; H02H 3/08; H02H 3/087; H02H 3/093; H02H 3/0935; H02H 3/10; H02H 3/105; H02H 1/0007; H02H 1/04; H02M 1/00; H02M 1/0006; H02M 1/0009; H02M 1/08; H02M 1/088; H02M 1/32; H02M 7/162; H02M 7/219; H02M 7/42; H02M 7/44; H02M 7/48; H02M 7/521; H02M 7/5387
USPC .......... 361/42, 44, 45, 78, 79, 87, 93.1–102; 363/50–58; 323/275–278; 327/108, 109
See application file for complete search history.

(56) References Cited

U.S. PATENT DOCUMENTS

| | | | |
|---|---|---|---|
| 10,109,995 B2* | 10/2018 | Yanagishima | ... H03K 17/08116 |
| 2017/0288385 A1* | 10/2017 | Naka | ................... H01L 29/7393 |
| 2020/0395747 A1* | 12/2020 | Wada | .................. H03F 3/45475 |

* cited by examiner

CIRCUIT ARRANGEMENT FOR CONTROLLING A PLURALITY OF SEMICONDUCTOR SWITCHES CONNECTED IN PARALLEL

BACKGROUND OF THE INVENTION

The present invention relates to a circuit arrangement for controlling a plurality of semiconductor switches connected in parallel, an arrangement comprising a plurality of semiconductor switches connected in parallel and such a circuit arrangement, and a use of such a circuit arrangement.

In order to control (or switch on and off) semiconductor switches, special circuit arrangements, so-called gate driver ICs (integrated circuits) can be used. Depending on the performance of the semiconductor switches to be controlled, sometimes even high control currents, for example in the two-digit ampere range, are required. In order to generate such high control currents, for example, a so-called booster unit can be used as part of the gate driver IC or in addition.

In high-power applications it is sometimes necessary for even a plurality of semiconductor switches to be connected in parallel in order to provide the required current-carrying capacity. For example, in the case of operation of electric machines, power converters connected in parallel, for example in the form of bridge circuits (for example so-called B6 bridge), can be used in order either to convert an AC voltage generated by the electric machine into a DC voltage or to convert a DC voltage for the operation of an electric machine into an AC voltage. Then, the power converter is referred to as a rectifier or an inverter, respectively. The power converters likewise include, for example, frequency converters in order to convert an AC voltage into an AC voltage of a different frequency.

It may now arise that an individual semiconductor switch suffers from a failure, which typically goes along with a short circuit in the half-bridge when the semiconductor switch connected in series in the half-bridge has been or is switched on. This can ultimately result in a fire in corresponding power electronics or in setting of an undesired torque of an electric machine.

In order to avoid this, the semiconductor switch connected in series in the half-bridge should be separated and a safe state should be produced, for example an active short circuit, in which all of the semiconductor switches on one side (low side or high side, expediently the side with the defective semiconductor switch) are closed or switched on.

If in this case a short circuit also occurs at the gate of the defective semiconductor switch, a voltage supply can nevertheless be short-circuited in such a circuit arrangement, for example via the booster unit. Depending on the power supply concept, this also couples over to the gate driver supply of a semiconductor switch on the same side of the bridge circuit, i.e. high side or low side, and short-circuits this as well, which prevents setting of the active short circuit.

SUMMARY OF THE INVENTION

In accordance with the invention, a circuit arrangement for controlling a plurality of semiconductor switches connected in parallel, an arrangement comprising a plurality of semiconductor switches connected in parallel and comprising such a circuit arrangement, and a use of such a circuit arrangement for controlling a plurality of semiconductor switches connected in parallel having the features of the independent patent claims are proposed. Advantageous configurations are the subject matter of the dependent claims and the description below.

The invention relates to a circuit arrangement for controlling a plurality of, i.e. two or more, semiconductor switches connected in parallel, in particular power semiconductors such as, for example, MOSFETs or IGBTs. The circuit arrangement has a switch-on terminal and a switch-off terminal, and a plurality of control terminals, which are each provided for connection to a control terminal, in particular a gate terminal or a gate, of one of the plurality of semiconductor switches. The switch-on terminal is in this case understood to mean a terminal for a potential which switches the semiconductor switch on, and the switch-off terminal is understood to mean a terminal with a potential which switches the semiconductor switch off. The switch-on terminal and the switch-off terminal are in use typically connected to a so-called gate driver, possibly with a suitable booster unit interposed, which gate driver makes available the mentioned potentials.

The switch-on terminal and the switch-off terminal are in this case each connected to each of the plurality of control terminals, i.e. the corresponding control terminals are connected in parallel and the corresponding semiconductor switches or their gates can be controlled in parallel. A path between switch-on terminal and control terminal is in this case typically referred to as a switch-on path, and a path between switch-off terminal and control terminal is referred to as a switch-off path.

In the case of the proposed circuit arrangement, there is now furthermore a switch disconnector provided between the switch-on terminal and at least one of the plurality of control terminals. However, it is preferred in this case when in each case one switch disconnector is provided between the switch-on terminal and each of the control terminals. In addition, the circuit arrangement has at least one detection and control arrangement, which is designed to detect a current flow into or out of the at least one of the control terminals—for example via a voltage drop across a resistor in the control path—and, when a short circuit is identified or it can be concluded that there is a short circuit, to control the switch disconnector causing it to open. In this case, too, it is advantageous to provide such a detection and control arrangement for each switch disconnector in the case of a plurality of such switch disconnectors.

From the current flow in the control path, a short circuit can be identified in particular when the current flow exceeds a preset threshold value for at least a preset time period. In this case, care should be taken to ensure that a high current can flow into or out of the control terminal even in the case of regular operation, but then only for a short time. A high current lasting for a longer period of time, however, means that it can be concluded that there is a short circuit. This can be converted, for example, by using a low-pass filter upstream of a comparator by means of which the short-term high currents are filtered out. At the comparator itself, a threshold value, based on the input differential voltage of the comparator, then only needs to be exceeded or undershot by the current flow.

It is expedient in this case if the at least one detection and control arrangement has a detection unit and a control unit, wherein the detection unit is designed to detect the current flow into or out of the corresponding control terminal, and wherein the control unit is designed to control the corresponding switch disconnector causing it to open when (possibly by means of the detection unit) a short circuit has been identified at the control terminal. In the case of a plurality of detection and control arrangements, this applies correspondingly for each of them.

In this way, a possibility is provided for decoupling the defective semiconductor switch or a corresponding chip or a corresponding module (depending on the way in which the gate signals are divided). Thus, crosstalk onto an adjacent semiconductor switch is prevented, and, as previously, intact semiconductor switches can continue to be controlled in order to distribute a current flowing owing to the active short circuit and to minimize the loading of the design and connection technology, in particular the bonding wires, as much as possible and to prevent a fire or the like.

Preferably, a diode is also provided between the switch-off terminal and the at least one of the control terminals, said diode having its forward direction in the direction of the switch-off terminal. It is also expedient here if in each case one such diode is provided between the switch-off terminal and each of the control terminals. Thus, the plurality of control terminals or the gates of the corresponding semiconductor switches can be latched with respect to one another.

A further subject matter of the invention is an arrangement comprising a plurality of semiconductor switches connected in parallel and comprising a circuit arrangement according to the invention, wherein the control terminals of the circuit arrangement are each connected to a control terminal of one of the plurality of semiconductor switches. The plurality of semiconductor switches connected in parallel are in this case preferably formed at least as part of a power converter, for example a bridge circuit. Such an arrangement can be, for example, part of power electronics for controlling an electric machine. A further subject matter of the invention is power electronics comprising such an arrangement, for example a bridge circuit, a power converter, an inverter etc.

A further subject matter of the invention is a use of a circuit arrangement according to the invention for controlling a plurality of semiconductor switches connected in parallel, wherein, by means of the detection and control arrangement, a current flow into or out of the at least one of the control terminals is detected, and, when the current flow exceeds a preset threshold value, the switch disconnector is controlled causing it to open.

BRIEF DESCRIPTION OF THE DRAWINGS

Further advantages and configurations of the invention can be gleaned from the description and the attached drawings.

The invention is illustrated schematically using an exemplary embodiment in the drawings and will be described below with reference to the drawings.

DETAILED DESCRIPTION

Figure 1:
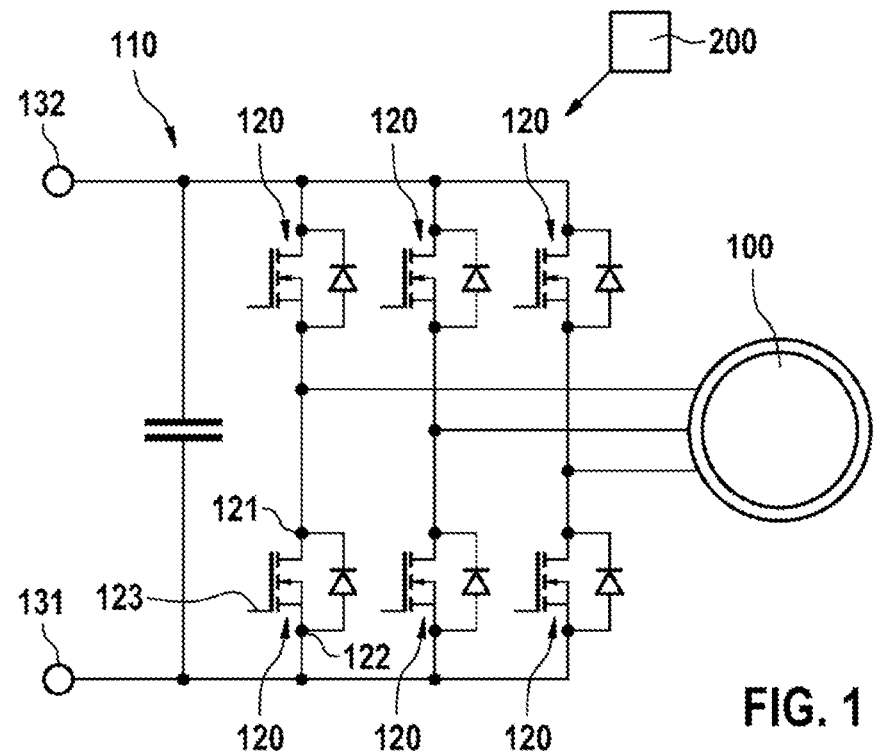
FIG. 1 shows, schematically, an arrangement according to the invention in a preferred embodiment for controlling an electric machine.

FIG. 1 shows, schematically, an arrangement according to the invention in a preferred embodiment for controlling an electric machine 100. The arrangement in this case comprises a circuit arrangement 200, which is in this case only indicated and will be explained in more detail with reference to the following figures, and a power converter 110, for example in the form of a so-called B6 bridge.

The power converter 110 has two DC voltage terminals 131, 132, which, in conventional fashion, in addition to a capacitor, are connected to, for example, six semiconductor switches 120, for example MOSFETs. A phase of the electric machine 100 is connected between in each case two of the semiconductor switches 120.

Each of the semiconductor switches 120 has a drain terminal 121, a source terminal 122 and a control terminal or gate terminal 123. The semiconductor switches 120 are in this case each of similar design.

During operation of the power converter 110, the individual semiconductor switches 120 are now controlled in a suitable manner causing them to open or close. For this purpose, the circuit arrangement 200, which is connected to the corresponding control terminals 123, is used. In the case of conventional control, for example, per branch one switch is always closed and the other open.

Figure 2:
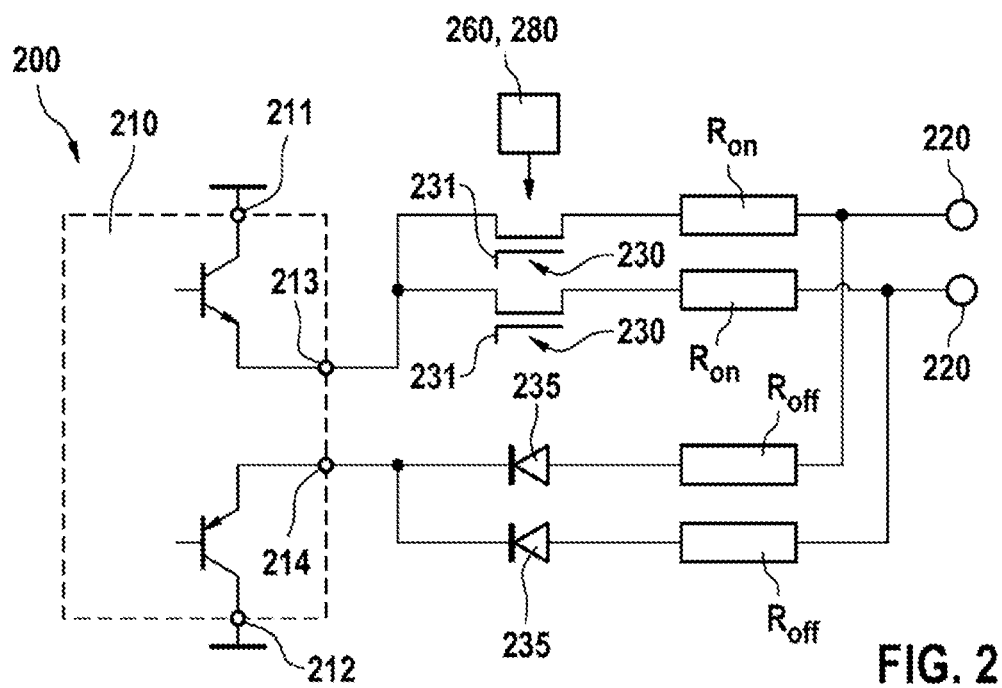
FIG. 2 shows, schematically, part of a circuit arrangement according to the invention in a preferred embodiment.

FIG. 2 shows, schematically, part of a circuit arrangement 200 according to the invention in a preferred embodiment for controlling a plurality of, in this case two, semiconductor switches connected in parallel. The circuit arrangement 200 has a switch-on terminal 213 and a switch-off terminal 214 for connection to suitable switching potentials which are in this case provided, for example, by a booster unit 210, which in turn has a positive power supply terminal 211 and a negative power supply terminal 212 for connection to a gate driver. The booster unit 210 can be part of the gate driver or the gate driver is connected upstream of the booster unit 210.

The switch-on terminal 213 and the switch-off terminal 214 are in this case each connected to, for example, two control terminals 220. Each of the control terminals 220 is in this case provided to be connected to a corresponding terminal or gate terminal 123 of a semiconductor switch, such as, for example, a semiconductor switch 120 as shown in FIG. 1. The semiconductor switches are in this way controlled in parallel, for example for parallel control of two B6 bridges.

The connection between the switch-on terminal 213 and a control terminal 220 in this case defines a switch-on path, i.e. the gate of the semiconductor switch can thus be connected to a potential which switches the semiconductor switch on, and the connection between the switch-off terminal 214 and the control terminal 220 defines a switch-off path, i.e. the gate of the semiconductor switch can thus be connected to a potential which switches the semiconductor switch off.

In addition, a switch-on resistor $R_{on}$ is provided in the switch-on path or between switch-on terminal 213 and control terminal 220, and a switch-off resistor $R_{off}$ is provided in the switch-off path or between switch-off terminal 214 and control terminal 220.

Furthermore, a switch disconnector 230, for example a MOSFET, is provided in each switch-on path, i.e. between switch-on terminal 213 and control terminal 220, by means of which switch disconnector the control terminal 220 can be disconnected from the switch-on terminal 213. In this case, each switch disconnector 230 has a control terminal or gate terminal 231, to which a control unit 260 is connected, which is only indicated here schematically. This control unit 260 in turn is connected to a detection unit 280, which is used for identifying a short circuit and is likewise only indicated schematically.

The control unit 260 and the detection unit 280, which together form a detection and control unit, are explained in more detail with reference to the following figures.

Figure 3:
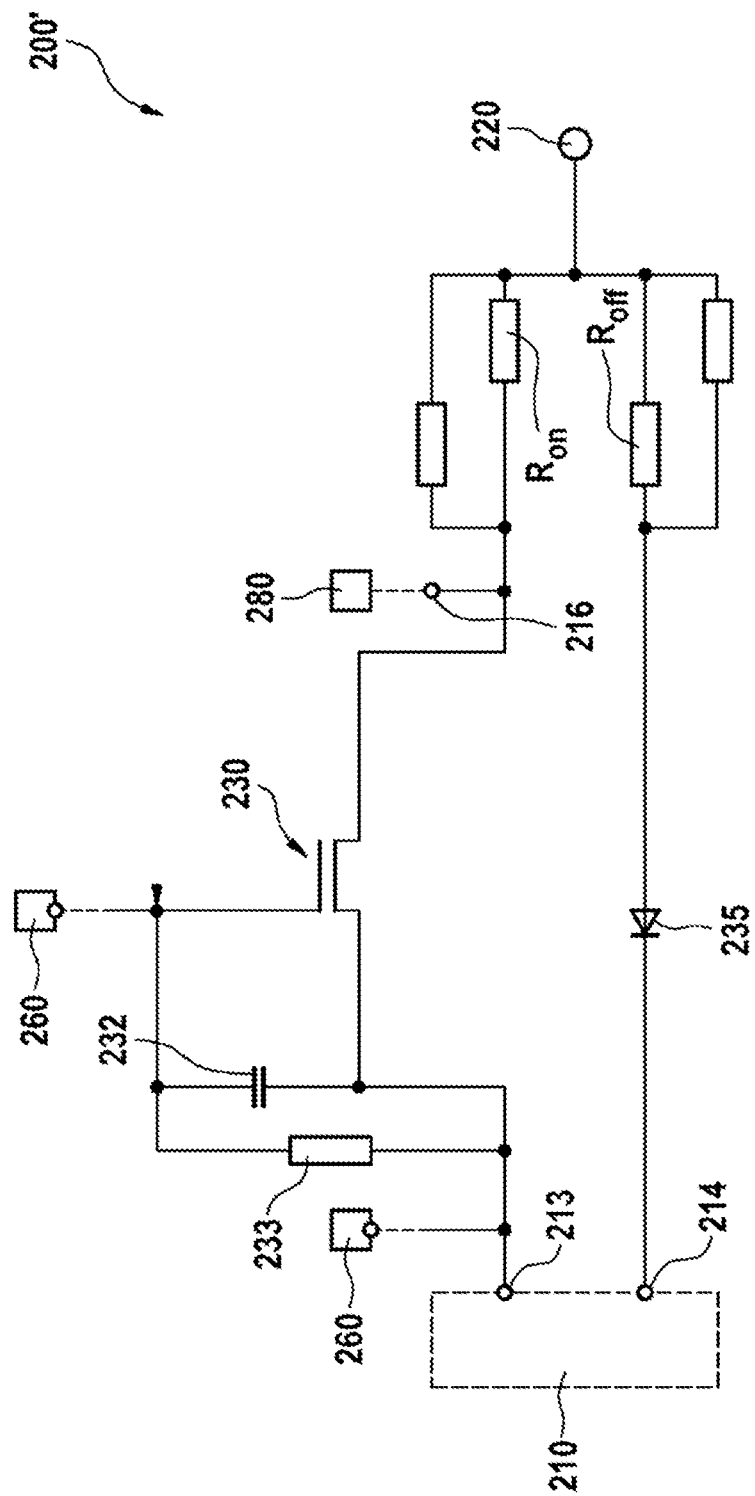
FIG. 3 shows, schematically, part of a circuit arrangement according to the invention in a further preferred embodiment.

FIG. 3 shows, schematically, part of a circuit arrangement 200' according to the invention in a further preferred embodiment. The circuit arrangement 200' corresponds, in terms of basic principle, to the circuit arrangement 200 shown in FIG. 2, with the result that to this extent reference can also be made to the description in respect of that figure. Here, however, by way of example, only one control terminal 220 is shown, wherein a capacitor 232 is provided between the switch-on terminal 213 and a control terminal 231 of the switch disconnector 230. This prevents the switch disconnector 230 from being unintentionally switched off in the case of a clocking operation of the booster unit 210 during an off phase. In order to control a plurality of semiconductor switches, correspondingly a plurality of such circuit arrangements 200' are to be connected to the switch-on terminal 213 and the switch-off terminal 214. The resistor connected in parallel with the capacitor 232 in this case ensures a defined potential at the gate of the switch disconnector 230 during startup of the circuit and a safe off state.

During operation, the switch disconnector 230 is introduced in series with the switch-on resistor $R_{on}$ (in this case a plurality of resistors is connected in parallel in order to increase the current-carrying capacity), by means of which switch disconnector a defective semiconductor switch can be decoupled in the event of a fault.

A so-called charge pump can be generated by a diode 262 (see FIG. 4) in the control unit, which charge pump enables voltages at the control terminal 231 below the negative supply voltage (cf. terminal 212) and therefore keeps the channel of the switch disconnector 230 closed during clocking operation even in the case of a negative voltage at the control terminal 220.

A discharge of the gate of the semiconductor switch to be decoupled takes place via the switch-off resistor $R_{off}$ (in this case a plurality of resistors is connected in parallel in order to increase the current-carrying capacity) and the diode 235. The diode 235 additionally serves the purpose of preventing a cross current from a non-functioning semiconductor switch into the parallel, but defective semiconductor switch or the gate path thereof via the switch-off resistors.

Figure 4:
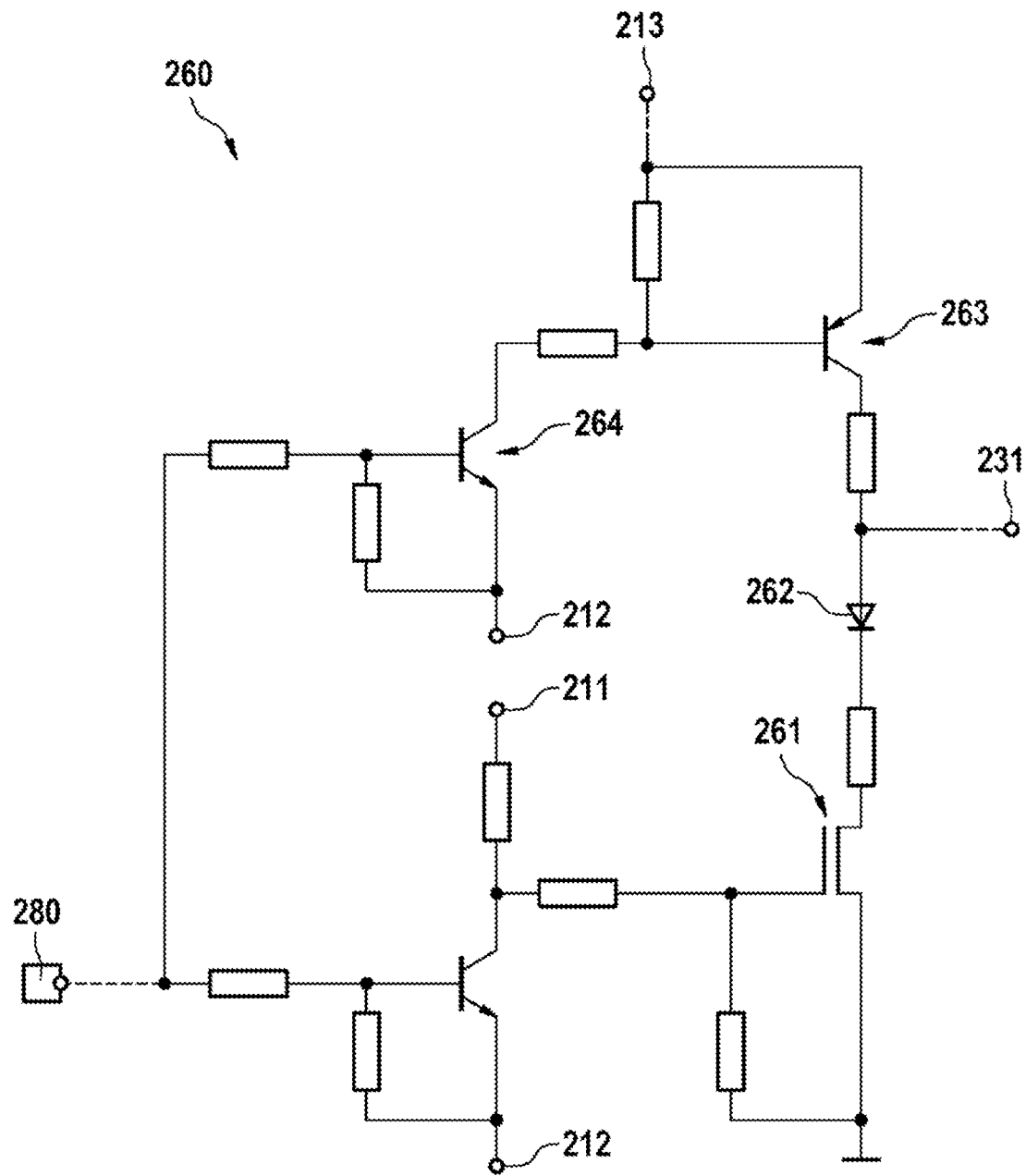
FIG. 4 shows, schematically, a further part of a circuit arrangement according to the invention in a preferred embodiment.

FIG. 4 shows, schematically, a further part of a circuit arrangement according to the invention in a preferred embodiment, namely a control unit 260, such as can be used, for example, in the circuit arrangement 200 shown in FIG. 2 or the circuit arrangement 200' shown in FIG. 3.

If there is no fault state present in the case of the relevant semiconductor switch to be monitored, the input of the control unit (terminal for the detection unit 280) is at low potential, and therefore the semiconductor switch 261, for example a MOSFET, is permanently switched on.

As a result, ground potential is present at the gate or control terminal 231 of the switch disconnector, for which reason said switch disconnector is controlled when the booster unit is switched on. The diode 262 prevents discharge of a capacitance of the control terminal 231 via the control unit or the control circuit when the booster unit is switched on and off cyclically during clocking operation.

In the event of a fault, i.e. when, for example, a short circuit is identified at the semiconductor switch in question, the input of the control unit is at high potential and the semiconductor switch 261 is switched off and the semiconductor switches 263, 264, for example transistors, are switched on. In this way, the control terminal 231 or the gate of the switch disconnector is charged quickly to the potential of the switch-on output 213 of the booster unit. Therefore, the switch disconnector 230 is opened and the defective semiconductor switch is decoupled.

Figure 5:
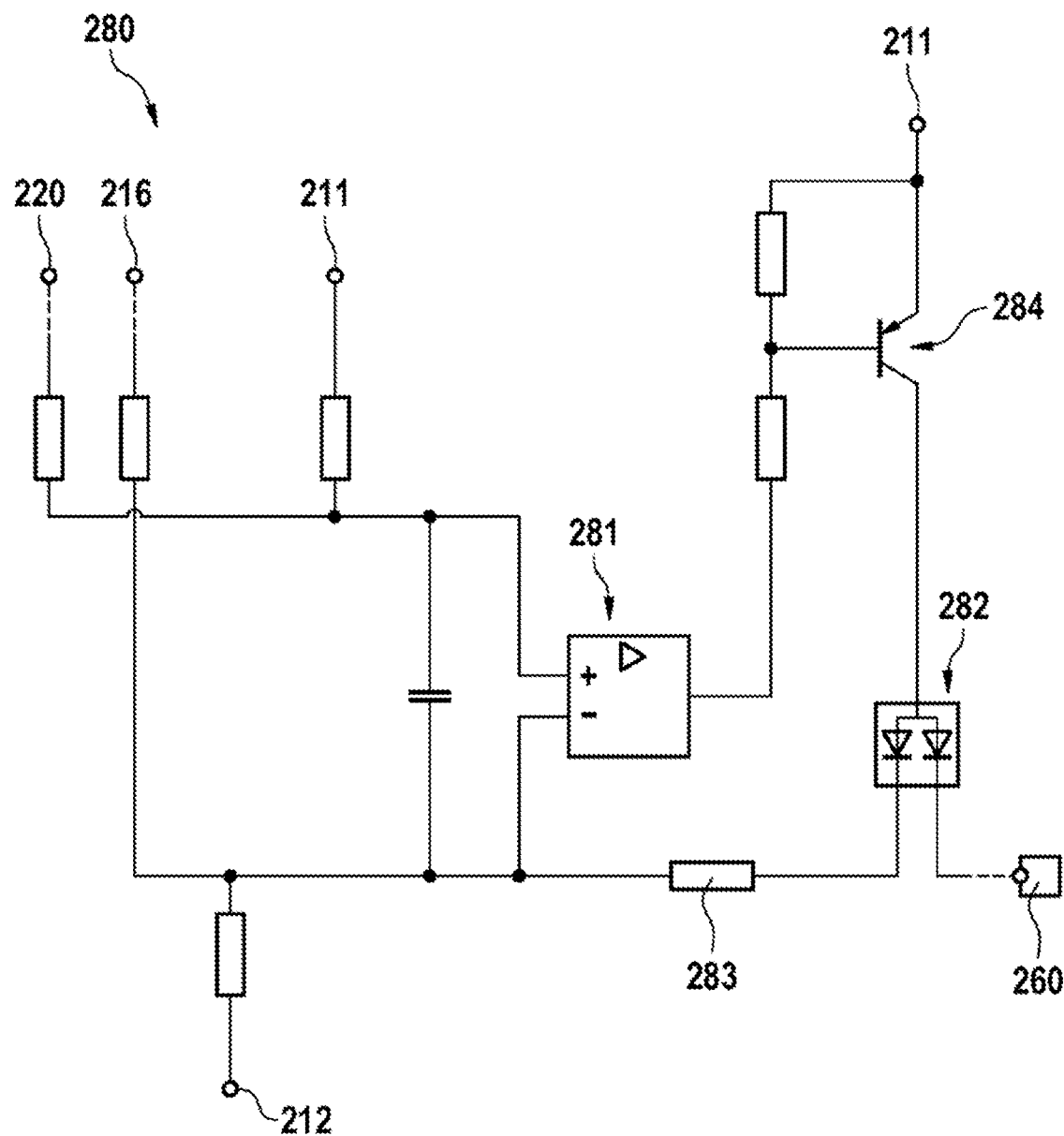
FIG. 5 shows, schematically, a further part of a circuit arrangement according to the invention in a preferred embodiment.

FIG. 5 shows, schematically, a further part of a circuit arrangement according to the invention in a preferred embodiment, namely a detection unit 280, such as can be used, for example, in the circuit arrangement 200 shown in FIG. 2, the circuit arrangement 200' shown in FIG. 3 or with the control unit 260 shown in FIG. 4.

During operation, monitoring of a current flow into or out of the gate (control terminal 220) takes place, in this case by means of a voltage drop across the switch-on resistor $R_{on}$ (cf. FIGS. 2 and 3) via the terminals 216 and 220. This voltage drop is compared with a reference value or threshold value by means of a comparator 281. Targeted switching operations of the semiconductor switch can be filtered out by means of a low-pass filter, i.e. a (sometimes high) current flow during a (regular) switching operation is not taken into consideration or is not identified as a short circuit in order to prevent false tripping.

An identified fault state, i.e. when the voltage drop exceeds the reference value or threshold value at the comparator, can be latched (so-called latch function) by means of feeding back the output signal of the comparator via the diode 282 and the resistor 283, i.e. the control unit 260 can permanently receive a corresponding signal or a corresponding voltage level in order to open the switch disconnector. In this case, the reference value or threshold value can be selected in such a way that, when said reference value or threshold value is exceeded, it can be assumed that there is a short circuit. In this case, each semiconductor switch is preferably provided with a separate detection unit for its switch-on resistor.

At this juncture it will be mentioned that further components illustrated in the circuits in FIGS. 3 to 5 are standard components and therefore some of these components are not designated or explained in any further detail. For example, the two resistors at the terminals 216, 220 and the capacitance at the inputs of the comparator 281 act as the already mentioned low-pass filter upstream of the comparator. The two resistors at the left-hand terminal 211 and the terminal 212 serve, for example, to set a response threshold on the basis of a differential voltage at the input of the comparator 281. The transistor 284 with the two upstream resistors serves to amplify the output power of the comparator 281.

The invention claimed is:

1. A circuit arrangement (200, 200') for controlling a plurality of semiconductor switches (120) connected in parallel, the circuit arrangement comprising:
   a switch-on terminal (213),
   a switch-off terminal (214),
   a plurality of control terminals (220), which are each provided for connection to a control terminal (123) of one of the plurality of semiconductor switches (120),
      wherein the switch-on terminal (213) and the switch-off terminal (214) are each connected to each of the plurality of control terminals (220), and wherein a potential of the switch-on terminal (213) is switchable, and
      wherein a switch disconnector (230) is provided between the switch-on terminal (213) and at least one of the control terminals (220),
   further comprising at least one detection and control arrangement (260, 280), which is designed to detect a current flow into the at least one of the control terminals (220) and, when a short circuit is identified from the current flow exceeding a preset threshold value for at least a preset time period, to control the switch disconnector (230) causing it to open, and a diode (235) provided between the switch-off terminal (214) and the at least one of the control terminals (220), the diode (235) having its forward direction in the direction of the switch-off terminal (214), and the diode connected to the switch-off terminal (214) and a switch-off resistor, the switch-off resistor provided between the switch-off terminal (214) and the at least one of the control terminals (220).

2. The circuit arrangement (200, 200') as claimed in claim 1, wherein in each case one switch disconnector (230) is provided between the switch-on terminal (213) and each of the control terminals (220).

3. The circuit arrangement (200, 200') as claimed in claim 2, comprising a plurality of detection and control arrangements (260, 280), which are each designed to detect the current flow in the corresponding ones of the control terminals (220) and, when a short circuit is identified from the current flow into the corresponding control terminal (220), to control the corresponding switch disconnector (230) causing it to open.

4. The circuit arrangement (200, 200') as claimed in claim 1, wherein the at least one detection and control arrangement has a detection unit (280) and a control unit (260), wherein the detection unit (280) is designed to detect the current flow into the corresponding control terminal (220) and to identify a short circuit from the current flow, and wherein the control unit (260) is designed to control the corresponding switch disconnector (230) causing it to open when a short circuit has been identified.

5. The circuit arrangement (200, 200') as claimed in claim 1, wherein a capacitor (232) is provided between the switch-on terminal (213) and a control terminal (231) of the switch disconnector (230).

6. An arrangement comprising a plurality of semiconductor switches (120) connected in parallel and comprising the circuit arrangement (200, 200') as claimed in claim 1, wherein the control terminals (220) of the circuit arrangement (200, 200') are each connected to a control terminal (123) of one of the plurality of semiconductor switches (120).

7. The arrangement as claimed in claim 6, wherein the plurality of semiconductor switches (120) connected in parallel are formed at least as part of a power converter.

8. A use of the circuit arrangement (200, 200') as claimed in claim 1 for controlling a plurality of semiconductor switches (120) connected in parallel, wherein, by means of the detection and control arrangement (260, 280), a current flow into the at least one of the control terminals (220) is detected, and, when a short circuit is identified from the current flow, the switch disconnector (230) is controlled causing it to open.

9. The circuit arrangement (200, 200') as claimed in claim 1, wherein the at least one detection and control arrangement (260, 280) includes a diode (262) keeping a channel of the switch disconnector (230) closed during clocking operation.

10. A circuit arrangement (200, 200') for controlling a plurality of semiconductor switches (120) connected in parallel, the circuit arrangement comprising:
  a switch-on terminal (213),
  a switch-off terminal (214),
  a plurality of control terminals (220), which are each provided for connection to a control terminal (123) of one of the plurality of semiconductor switches (120),
    wherein the switch-on terminal (213) and the switch-off terminal (214) are each connected to each of the plurality of control terminals (220), and
    wherein a switch disconnector (230) is provided between the switch-on terminal (213) and at least one of the control terminals (220), and wherein a potential of the switch-on terminal (213) is switchable,
  further comprising
  at least one detection and control arrangement (260, 280) has a detection unit (280) and a control unit (260), which is designed to detect a current flow into the at least one of the control terminals (220) and, when a short circuit is identified from the current flow, to control the switch disconnector (230) causing it to open, wherein the detection unit (280) includes a low-pass filter, and
  a diode (235) provided between the switch-off terminal (214) and the at least one of the control terminals (220), the diode (235) having its forward direction in the direction of the switch-off terminal (214), and the diode connected to the switch-off terminal (214) and a switch-off resistor, the switch-off resistor provided between the switch-off terminal (214) and the at least one of the control terminals (220).

* * * * *